United States Patent [19]

Oyama et al.

[11] Patent Number: 4,859,532

[45] Date of Patent: Aug. 22, 1989

[54] TRANSPARENT LAMINATED PRODUCT

[75] Inventors: Takuji Oyama; Koichi Suzuki; Mamoru Mizuhashi, all of Yokohama, Japan

[73] Assignee: Asahi Glass Company Ltd., Tokyo, Japan

[21] Appl. No.: 125,236

[22] Filed: Nov. 25, 1987

[30] Foreign Application Priority Data

Nov. 27, 1986 [JP] Japan .................................. 61-280644
Nov. 27, 1986 [JP] Japan .................................. 61-280645
Nov. 27, 1986 [JP] Japan .................................. 61-280646

[51] Int. Cl.$^4$ .............................................. B32B 15/04
[52] U.S. Cl. ..................................... 428/336; 428/469; 428/472
[58] Field of Search ............... 428/457, 469, 216, 472; 350/1.7, 166

[56] References Cited

U.S. PATENT DOCUMENTS

| | | | |
|---|---|---|---|
| 4,179,181 | 12/1979 | Chang | 350/166 X |
| 4,368,945 | 1/1983 | Fujimori et al. | 350/1.7 |
| 4,510,190 | 4/1985 | Glaser | 428/34 |
| 4,547,432 | 10/1985 | Pitts et al. | 428/469 X |
| 4,565,719 | 1/1986 | Phillips et al. | 428/34 |
| 4,710,433 | 12/1987 | Rowe et al. | 428/469 X |

FOREIGN PATENT DOCUMENTS

| | | |
|---|---|---|
| 0031278 | 7/1981 | European Pat. Off. . |
| 0226993 | 7/1981 | European Pat. Off. . |
| 47-6315 | 2/1972 | Japan .................................. 350/1.7 |

OTHER PUBLICATIONS

Glass Technology, vol. 21, No. 5, Oct. 1980, pp. 254–261, Gläer: Improved Insulating Glass with Low Emissivity Coatings Based on Gold, Silver, or Copper Films . . . .

Primary Examiner—Thomas J. Herbert
Attorney, Agent, or Firm—Oblon, Spivak, McClelland, Maier & Neustadt

[57] ABSTRACT

A transparent laminated product comprising a transparent substrate and a coating composed of transparent oxide and silver layers alternately laminated in a total of $(2n+1)$ ($n \geq 2$) layers with the inner most and outer most layers being transparent oxide layers and having a surface resistance of at most 10 $\Omega$/sq. and a visible ray transmission of at least 60%.

1 Claim, 3 Drawing Sheets

TRANSPARENT LAMINATED PRODUCT

BACKGROUND OF THE INVENTION

1. Field of the Invention

The present invention relates to a transparent laminated product having electrical conductivity, infrared reflectivity and electromagnetic wave shielding effect.

2. Discussion of Background

Heretofore, it has been in practice to form a layer of indium oxide or tin oxide on a glass or plastic substrate and to use the product as a transparent conductive substrate. However, the specific resistance of the transparent conductive layer of this type was at a level of $5 \times 10^{-4}$ Ω.cm when formed at room temperature, and in order to obtain a surface resistance of not higher than 10 Ω/sq., it used to be required to have a layer thickness of at least 5,000 Å. Further, the transparent conductive layer of this type had a refractive index of about 2.0, and when formed on a glass substrate having a refractive index of e.g. 1.5, it had a reflectance as high as about 25%, whereby the surface glare was strong, such being undesirable from the viewpoint of outer appearance.

It has been reported that the specific resistance of the transparent conductive layer of this type can be reduced to a level of $1 \times 10^{-4}$ Ω.cm by forming such a transparent conductive layer on a substrate at a high temperature. However, it is undesirable to heat the substrate from the viewpoint of the production, since such operation adds to the cost.

There are two types of infrared reflecting glass. Namely, the first type is a so-called solar control which is used primarily for the purpose of reducing an air-cooling load, and the second type is a so-called heat mirror which is used primarily for the purpose of reducing a heating load. The minimum characteristics required for the second type are a high transmission at the visible region and a sufficiently high reflectance at the infrared region. However, if the reflectance at the near infrared region can be increased, it will also have a function as a solar control, such being preferred. The following three types of coating have been known for the infrared reflecting glass of this type:

(1) Thin layer of a metal having a thickness of the about 100 Å.
(2) Doped oxide semiconductor layer
(3) 3-Layered coating of dielectric layer/metal layer/dielectric layer.

Specifically, as type (1), a thin layer of Au, Ag or Cu is used, and as type (2), a layer of $SnO_2$ or $In_2O_3$ having a thickness of at least 5,000 Å is used. As type (3), a structure in which a silver layer is sandwiched between dielectric layers, is disclosed in Japanese Examined Patent Publication No. 6315/1972.

Among them, type (1) has a drawback such that in order to obtain a sufficiently high reflectance at the infrared region, the metal layer is required to be thick, whereby the transmittance at the visible region will be low. Type (2) has drawbacks such that in order to obtain a sufficiently high reflectance at the infrared region, the thickness of the layer is required to be as thick as at least 5,000 Å, and the reflectance at the near infrared region can not be improved.

Whereas, type (3) is advantageous in that the dielectric layers having a metal layer interposed therebetween serve as a reflection preventing layer, whereby a sufficiently high reflectance at the infrared region and a high transmission at the visible region can be obtained with an overall layer thickness of not higher than 1,000 Å, and thus this type is widely used. However, even with this type, the thickness of the intermediate metal layer is required to be not higher than 200 Å, preferably not higher than 150 Å, in order to obtain a high level of transmittance at the visible region, whereby the reflectance at the infrared region will be about 95% at best, hence the emittance will be about 5%. Further, the reflectance at the near infrared region can not be improved, and the reflectance of the solar energy will be not higher than about 25%.

In order to obtain a sufficiently high visible ray transmission and at the same time to control the visible ray reflectance to a level of a usual transparent glass, the silver layer thickness was limited to a level of about 120 Å, and the surface resistance was thereby about 12 Ω/sq. This is because the specific resistance of silver in the form of a thin layer is greater than the value of the bulk. Further, as will be given as a Comparative Example hereinafter, the spectral reflectivity will be in a U-form at the visible region, and the reflection color will be restricted to a color of violet type, whereby variation in the color will be limited, which is a serious drawback from the ornamental point of view.

In summary, the conventional techniques had the following drawbacks:

(a) In order to obtain a high transmission at the visible region and a sufficiently high reflectance at the infrared region, type (3) is the best. However, it is still inadequate.
(b) The color of reflection is limited to a color of violet type.
(c) The rising of reflectance at the near infrared region is not sharp.

SUMMARY OF THE INVENTION

It is an object of the present invention to solve the above-mentioned drawbacks inherent to the conventional techniques and to provide a transparent electrically conductive laminated product having an adequately low surface resistance, an adequately high visible ray transmission and a visible ray reflectance at a level of a usual transparent glass sheet.

Another object of the present invention is to solve the above-mentioned drawbacks inherent to the conventional techniques an to provide a novel transparent infrared reflecting laminated product having a very high reflectance at the infrared region and a sufficiently high transmission at the visible region, whereby the color of reflection can be varied fairly freely.

A further object of the present invention is to provide a novel transparent infrared reflecting laminated product having a very high reflectance at the infrared region and a sufficiently high transmission at the visible region, whereby the reflectance at the near infrared region shows sharp rising.

The present invention provides a transparent laminated product comprising a transparent substrate and a coating composed of transparent oxide and silver layers alternately laminated in a total of $(2n+1)$ layers $(n \geq 2)$ with the inner most and outer most layers being transparent oxide layers and having a surface resistance of at most 10 Ω/sq. and a visible ray transmission of at least 60%.

Further, the present invention provides a transparent laminated product comprising a transparent substrate and a 5-layered transparent coating composed of a first ZnO layer formed on the substrate, a second Ag layer formed on the first layer, a third ZnO layer formed on the second layer, a fourth Ag layer formed on the third layer and a fifth ZnO layer formed on the fourth layer, and having a visible ray transmission of at least 60%, wherein the thickness of each Ag layer is from 60 to 250 Å.

Furthermore, the present invention provides a transparent laminated product comprising a transparent substrate and a 5-layered coating composed of a first transparent oxide layer formed on the substrate, a second silver layer formed on the first layer, a third transparent oxide layer formed on the second layer, a fourth silver layer formed on the third layer and a fifth transparent oxide layer formed on the fourth layer, and having a visible ray transmission of at least 70%, wherein the thickness of each silver layer is at most 110 Å.

DETAILED DESCRIPTION OF THE PREFERRED EMBODIMENTS

Now, the present invention will be described in detail.

Figure 1:
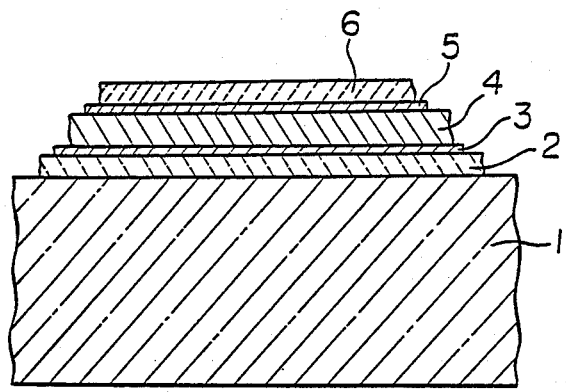
FIGS. 1 and 2 are diagramatic cross-sectional views of typical embodiments of the present invention, wherein each of reference numerals 1 and 10 designates a transparent substrate, each of numerals 2, 4, 6 and 11 designates a transparent oxide layer and each of numerals 3, 5 and 12 designates a silver layer.
Figure 2:
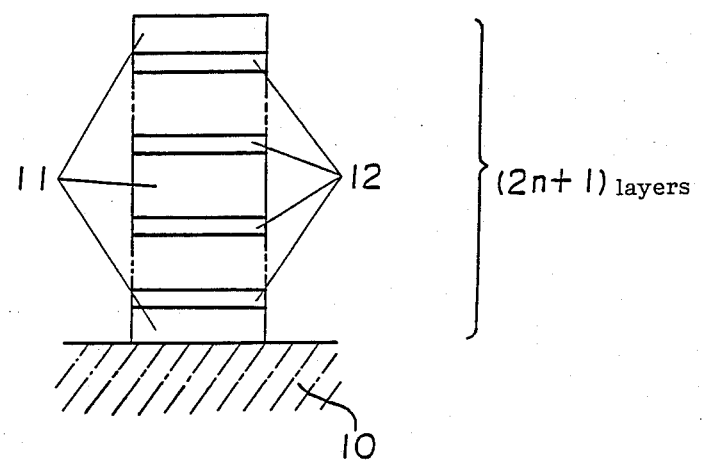

FIGS. 1 and 2 show partial cross-sectional views of transparent laminated products of the present invention. In FIG. 1, reference numeral 1 designates a transparent substrate, numeral 2 designates a first transparent oxide layer, numeral 3 designates a second silver layer, numeral 4 designates a third transparent oxide layer, numeral 5 designates a fourth silver layer and numeral 6 designates a fifth transparent oxide layer. In FIG. 2, reference numeral 10 designates a transparent substrate, numeral 11 designates a transparent oxide layer, and numeral 12 designates a silver layer.

In the present invention, the transparent substrate may be a glass sheet or a plastic sheet. More specifically, it may be usual sheet glass or float glass made of colorless transparent or colored transparent soda lime silica glass depending upon the desired visible ray transmission or color tone. Further, it may be heat ray absorbing glass having various colors such as blue, bronze or green, or various other types of glass including aluminosilicate glass, lithium aluminosilicate glass and borosilicate glass.

As the transparent oxide layer in the present invention, a material having a high refractive index, for example, a material having a refractive index within a range of from 1.7 to 2.5, may be employed such as ZnO, $TiO_2$, $ZrO_2$, $In_2O_3$, $SnO_2$, $Ta_2O_5$ and their compounds. Among them, ZnO is most suitable from the viewpoint of productivity since the layer-forming speed in sputtering is high.

In a preferred embodiment of the present invention, the thickness of each layer may be roughly as follows, although it may vary depending upon the material to be used.

Namely, the inner most and outer most transparent oxide layers (e.g. the first and fifth layers in the case of a 5-layered coating, and the first and seventh layers in the case of a 7-layered coating) have a thickness of from 200 to 600 Å, and other transparent oxide layers (e.g. the third layer in the case of the 5-layered coating, and the third and fifth layers in the case of the 7-layered coating) have a thickness of from 400 to 1,200 Å. Each silver layer has a thickness of from 60 to 250 Å. These thickness ranges are set to obtain an adequate visible ray transmission. If the layer thicknesses depart from these ranges, the antireflection condition will be broken, or the visible ray transmission will be low.

The thickness of the silver layer is suitably selected within the above-mentioned range of from 60 to 250 Å depending upon the required properties. For example, in order to obtain electric conductivity with particularly low resistance, for example, to obtain a surface resistance of not higher than 6 Ω/sq., the silver layer should preferably be thick, for example, within a range of from 110 to 250 Å.

Further, the silver layer should preferably be thick in order to make the rising of reflectance sharp at the near infrared region. However, there will then be side effects such that the transmission at the visible region tends to be low, the low reflectance region tends to be narrow, and the variation in the color of reflection by the control of the layer thickness will be rather limited. On the other hand, the silver layer should preferably be thin from the viewpoint of an increase of the transmission and freedom in the choice of the reflection color. However, then, the rising of the reflectance at the near infrared region tends to be blunt, and the reflectance at the infrared region also decreases. Further, if the silver layer thickness is too thin, silver may form island structure, whereby the desired properties will not be obtained. For these reasons, the silver layer should preferably have a thickness of from 60 to 110 Å, more preferably from 80 to 110 Å, in order to obtain a high transmission at the visible range and a wide range of selection of the reflection color.

The multi-layered coating of the present invention can readily be formed by vacuum evaporation, sputtering or ion plating. However, the method of forming the coating is not restricted to such methods, and other techniques such as a dipping method or a spray method may also be employed.

For the purpose of improving the adhesion or durability of the coating layers, an interlayer having a thickness not to substantially affect the optical properties may be inserted at the interface with the substrate or at the interface between adjacent layers or at the interface with air.

With respect to the transparent oxide layers of the present invention, it is preferred from the viewpoint of the production that all of the transparent oxide layers are made of the same material. However, the present invention is not restricted to such an embodiment, and the respective layers may be made of different materials.

In the transparent laminated product of the present invention, silver layers bearing even numbers such as the second and fourth layers serve as conductive layers. The resistivity of a silver layer is lower by at least one figure than that of an indium oxide layer or a tin oxide layer, and it is thereby possible to obtain a surface resistance of not higher than 10 $\Omega$/sq., particularly not higher than 6 $\Omega$/sq., with an overall layer thickness of about 2,000 Å.

Further, the silver layers bearing the even numbers serve to increase the reflectance at the infrared region.

In the transparent laminated product of the present invention, the transparent oxide layers bearing odd numbers such as the first, third and fifth layers serve as reflection preventing layers at the visible region of the silver layers and serve to increase the visible ray transmission and at the same time reduce the visible ray reflectance so that they function as transparent conductive layers or infrared reflecting layers having a visible ray transmission of at least 60%, particularly at least 70%, as a whole.

In the present invention, it is possible to change the reflection color relatively freely while maintaining a high transmittance at the visible region and a high reflectance at the near infrared to the infrared region, by adjusting the layer thicknesses of the respective layers within suitable ranges.

Now, the present invention will be described in further detail with reference to Examples. However, it should be understood that the present invention is by no means restricted to such specific Examples.

EXAMPLE 1

A glass substrate was set in a vacuum chamber, and the chamber was evacuated to $1 \times 10^{-6}$ Torr. Then, oxygen gas was introduced, and the pressure was adjusted to $1.7 \times 10^{-3}$ Torr. Then, a zinc target was subjected to radio frequency magnetron sputtering to form a ZnO layer of about 400 Å on the substrate at room temperature as a first layer. Then, the introduced gas was changed to argon and the pressure was adjusted to $1.3 \times 10^{-3}$ Torr, whereupon a silver target was subjected to radio frequency magnetron sputtering to form a Ag layer of about 120 Å as a second layer. Then, a third layer of ZnO was formed under the same condition as for the first layer in a thickness of about 800 Å. Then, a fourth layer of Ag was formed under the same condition as for the second layer in a thickness of about 120 Å. Then, a fifth layer of ZnO was formed under the same condition as for the first layer in a thickness of about 400 Å. The total thickness of the coating was about 1,840 Å.

The surface resistance of the sample No. 1 thus obtained was measured by a four point probe method and found to be 4.2 $\Omega$/sq.

This sample had a visible ray transmission of 77.5% and a visible ray reflectance of 7.6%.

EXAMPLE 2

A glass substrate was set in a vacuum chamber, and the chamber was evacuated to $1 \times 10^{-6}$ Torr. Then, oxygen gas was introduced, and the pressure was adjusted to $1.7 \times 10^{-3}$ Torr. Then, a zinc target was subjected to radio frequency magnetron sputtering to form a ZnO layer on the substrate as a first layer. The thickness of the first layer was about 400 Å. Then, in an argon atmosphere under a pressure of $1.4 \times 10^{-3}$ Torr, a silver target was subjected to radio frequency magnetron sputtering to form a Ag layer as a second layer. The thickness of the second layer was about 100 Å. Then, a third layer of ZnO was formed under the same condition as for the first layer in a thickness of about 800 Å. Then, a fourth layer of Ag was formed under the same condition as for the second layer in a thickness of about 100 Å. Then, a fifth layer of ZnO was formed under the same condition as for the first layer in a thickness of about 400 Å.

The surface resistance of the sample thus obtained was measured by a four point probe method and found to be 5.5 $\Omega$/sq.

Figure 3:
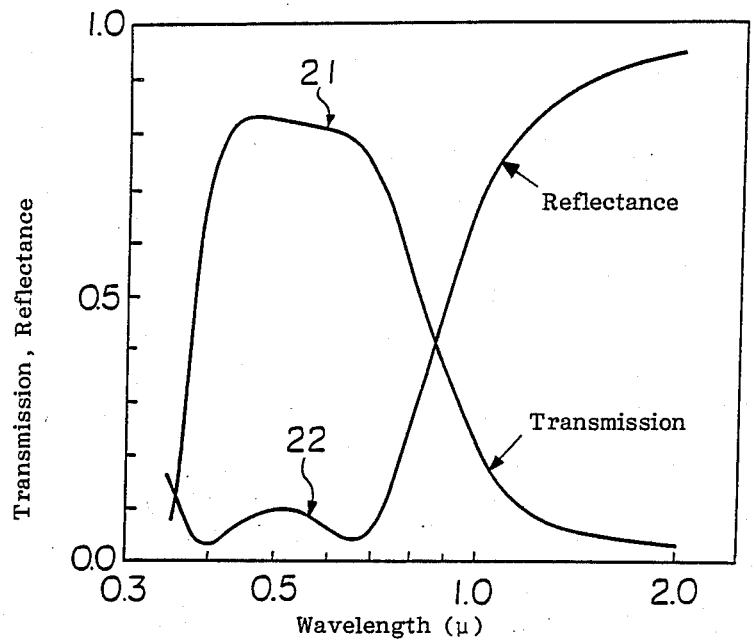
FIG. 3 is a graph showing the spectral properties of Example 2, wherein reference numerals 21 and 22 represent the spectral transmittance and reflectance of Example 2, respectively.

The spectral transmittance and the spectral reflectance of the sample No. 2 thus obtained are shown at 21 and 22, respectively in FIG. 3. The Figure shows a high transmission at the visible range, a sharp rising of reflection at the near infrared region and the presence of the maximum in reflection at the center of the visible region. The color of reflection was green. The reflectance at a wavelength of 10 $\mu$m was 95%.

The properties were as follows:

| | |
|---|---|
| Visible ray transmission $T_V$: | 80.2% |
| Solar energy transmission $T_E$: | 47.2% |
| Visible ray reflectance $R_V$: | 6.0% |
| Solar energy reflectance $R_E$: | 33.9% |
| Reflectance at a wavelength of 10 $\mu$m R(10$\mu$): | 95% |
| Color of reflection: | Green |

EXAMPLE 3

A 5-layered coating was formed on a glass substrate under the same conditions as in Example 2 except that the thickness of the third layer was changed to about 650 Å. The surface resistance was found to be 5.5 $\Omega$/sq. The spectral curves of the sample No. 3 thus obtained showed a high transmission at the visible region and a sharp rising of the reflectance at the near infrared region, and reflection characteristics with a higher reflection at the longer wavelength side in the visible region. The color of reflection was bronze. The reflectance at a wavelength of 10 $\mu$m was 95%. The properties were as follows:

| | |
|---|---|
| $T_V$: | 76.9% |
| $T_E$: | 44.0% |
| $R_V$: | 8.8% |
| $R_E$: | 38.8% |
| R (10$\mu$): | 95% |
| Color of reflection: | Bronze |

EXAMPLE 4

A 5-layered coating was formed on a glass substrate under the same conditions as in Example 2 except that the thickness of the third layer was changed to about 950 Å. The surface resistance was found to be 5.4 $\Omega$/sq. The spectral curves of the sample No. 4 thus obtained showed a high transmission at the visible region and a sharp rising of the reflectance at the near infrared region, and reflection characteristics with a higher reflection at the shorter wavelength side in the visible region.

The color of reflection was bluish green. The reflectance at a wavelength of 10 μm was 95%.

The properties were as follows:

| | |
|---|---|
| $T_V$: | 78.7% |
| $T_E$: | 45.4% |
| $R_V$: | 8.1% |
| $R_E$: | 31.9% |
| R (10μ): | 95% |
| Color of reflection: | Bluish green |

EXAMPLE 5

$TiO_2$ was used as the transparent oxide. In the same manner as in Example 2, a glass substrate was prepared. Then, a titanium target was subjected to radio frequency magnetron sputtering to form a $TiO_2$ layer on the substrate as a first layer. The thickness of the first layer was about 350 Å. Then, in the same manner as in Example 2, a Ag layer was formed as a second layer in a thickness of about 100 Å. Then, a third layer of $TiO_2$ was formed under the same condition as for the first layer in a thickness of about 700 Å. Then, a fourth layer of Ag was formed under the same condition as for the second layer in a thickness of about 100 Å. Then, a fifth layer of $TiO_2$ was formed under the same condition as for the first layer in a thickness of about 350 Å. The surface resistance was found to be 5.5 Ω/sq.

The spectral curves of the sample No. 4 thus obtained showed a high transmission at the visible region and a sharp rising of the reflectance at the near infrared region, and the presence of the maximum in the reflection at the center of the visible region. The color of reflection was green. The reflectance at a wavelength of 10 μm was 95%.

The properties were as follows:

| | |
|---|---|
| $T_V$: | 78.7% |
| $T_E$: | 53.2% |
| $R_V$: | 8.5% |
| $R_E$: | 28.2% |
| R (10μ): | 95% |
| Color of reflection: | Green |

EXAMPLE 6

A glass substrate was set in a vacuum chamber, and the chamber was evacuated to $1 \times 10^{-6}$ Torr Then, oxygen gas was introduced, and the pressure was adjusted to $1.7 \times 10^{-3}$ Torr. Then, a zinc target was subjected to radio frequency magnetron sputtering to form a ZnO layer on the substrate as a first layer. The thickness of the first layer was about 400 Å. Then, in an argon atmosphere under a pressure of $1.4 \times 10^{-3}$ Torr, a silver target was subjected to radio frequency magnetron sputtering to form a Ag layer as a second layer. The thickness of the second layer was about 140 Å. Then, a third layer of ZnO was formed under the same condition as for the first layer in a thickness of about 800 Å. Then, a fourth layer of Ag was formed under the same condition as for the second layer in a thickness of about 140 Å. Then, a fifth layer of ZnO was formed under the same condition as for the first layer in a thickness of about 400 Å. The surface resistance was found to be 3.4 Ω/sq.

Figure 4:
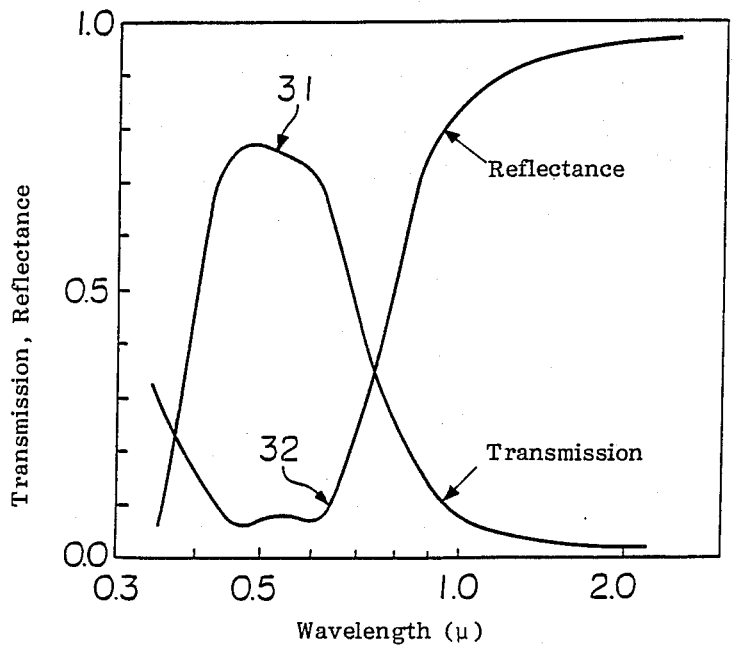
FIG. 4 is a graph showing the spectral properties of Example 6, wherein reference numerals 31 and 32 represent the spectral transmittance and reflectance of Example 6, respectively.

The spectral transmittance and the spectral reflectance of the sample No. 6 thus obtained are shown at 31 and 32, respectively, in FIG. 4. The Figure shows a high transmission at the visible range, a sharp rising of reflection at the near infrared region and the presence of the maximum in reflection at the center of the visible region. The color of reflection was purple. The reflectance at a wavelength of 10 μm was 98%.

The properties were as follows:

| | |
|---|---|
| Visible ray transmission $T_V$: | 72.7% |
| Solar energy transmission $T_E$: | 38.2% |
| Visible ray reflectance $R_V$: | 8.1% |
| Solar energy reflectance $R_E$: | 47.3% |
| Reflectance at a wavelength of 10 μm R(10μ): | 98% |
| Color of reflection: | Purple |

EXAMPLE 7

A 5-layered coating was formed on a glass substrate under the same conditions as in Example 6 except that the thickness of the second and fourth layers were changed to about 200 Å. The spectral curves of the sample No. 7 thus obtained showed a high transmission at the visible region and a sharp rising of the reflectance at the near infrared region. The color of reflection was purple. The reflectance at a wavelength of 10 μm was 99%.

The properties were as follows:

| | |
|---|---|
| $T_V$: | 63.1% |
| $T_E$: | 21.8% |
| $R_V$: | 17.0% |
| $R_E$: | 60.8% |
| R (10μ): | 99% |
| Color of reflection: | Purple |

EXAMPLE 8

With respect to the samples No. 1 and No. 7 (size: 5 cm × 15 cm × 0.3 cm) obtained in Examples 1 and 7, the attenuation of the electric field intensity was measured at frequencies of 600, 800 and 1,000 MHz by means of an electromagnetic wave shielding effect measuring apparatus (R 4172 Model, manufactured by Takeda Riken K.K.). The results are shown in the following Table. Sample 8 is a $SnO_2$-coated glass plate having a surface resistance of 15 Ω/sq., which represents a comparative example.

| | Frequency (MHz) | | |
|---|---|---|---|
| | 600 MHz | 800 MHz | 1,000 MHz |
| Sample 1 | −30 dB | −35 dB | −40 dB |
| Sample 7 | −38 dB | −42 dB | −47 dB |
| Sample 8 | −14 dB | −19 dB | −24 dB |

As is evidence from the above Tables, the samples 1 and 7 of the present invention have excellent electromagnetic wave shielding effects.

COMPARATIVE EXAMPLE 1

In the same manner as in Example 2, a glass substrate was prepared. Then, a zinc target was subjected to radio frequency magnetron sputtering to form a ZnO layer on the substrate as a first layer in a thickness of about 400 Å. Then, in the same manner as in Example 2, a Ag layer was formed as a second layer in a thickness of about 100 Å. Then, a ZnO layer was formed as a third layer in a thickness of about 400 Å under the same condition as for the first layer. The surface resistance was found to be 12.1 Ω/sq.

Figure 5:
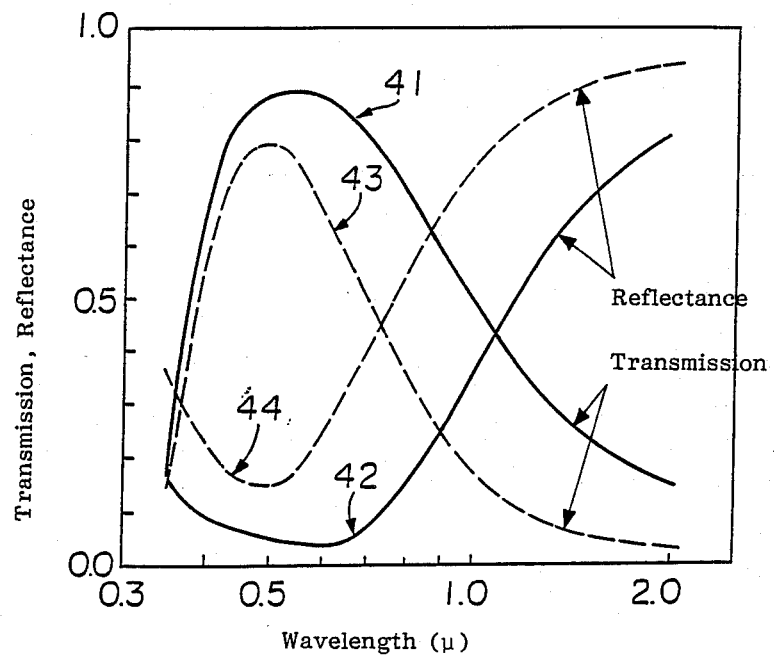
FIG. 5 is a graph showing the spectral properties of Comparative Examples 1 and 2, wherein reference numerals 41 and 42 represent the spectral transmittance and reflectance of Comparative Example 1, respectively, and reference numerals 43 and 44 represent the spectral transmittance and reflectance of Comparative Example 2, respectively.
Figure 6:
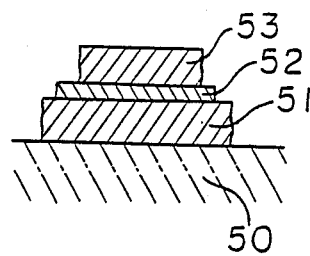
FIG. 6 is a diagramatic cross-sectional view of Comparative Example 1, wherein reference numeral 50 designates a transparent substrate, each of numerals 51 and 53 designates a transparent dielectric layer, and numeral 52 designates a silver layer.

The spectral transmission and the reflectance of the sample No. 9 thus obtained are shown by the spectral curves 41 and 42 in FIG. 5, respectively. As compared with FIGS. 3 and 4, the rising of the reflectance at the near infrared region is blunt, and the reflection curve at the visible region exhibits a U-shape, and the color of reflection was bluish purple. The reflectance at a wavelength of 10 μm was 85%, which is inferior to Examples 2 to 6.

The properties were as follows:

| | |
|---|---|
| $T_V$: | 84.0% |
| $T_E$: | 63.8% |
| $R_V$: | 5.9% |
| $R_E$: | 22.3% |
| R (10μ): | 85% |
| Color of reflection: | Bluish purple |

COMPARATIVE EXAMPLE 2 A 3-layered coating was formed on a glass substrate under the same conditions as in Comparative Example 1 except that the thickness of the second silver layer was changed to about 200 Å. The surface resistance was found to be 4.9 Ω/sq. The spectral transmittance and the spectral reflectance of the sample No. 10 thus obtained are shown at 43 and 44 in FIG. 5. As compared with FIG. 4, the reflectance at the near infrared region is at the same level, but the transmittance at the visible region is lower and the reflectance is substantially higher. The color of reflection was reddish purple. The properties were as follows:

| | |
|---|---|
| $T_V$: | 67.8% |
| $T_E$: | 40.2% |
| $R_V$: | 23.2% |
| $R_E$: | 50.1% |
| R (10μ): | 93% |
| Color of reflection: | Reddish purple |

As is evident from the foregoing, according to the present invention, it is possible to obtain a transparent conductive laminated product having an adequately high visible ray transmission, an adequately low surface resistance and a low visible ray reflectance comparable to glass, with a coating having a thickness which is less than one half of the thickness required for the conventional transparent coating to obtain the same level of the surface resistance.

When used as a transparent electrode for a display element such as a liquid crystal display element, the product of the present invention serves for the improvement in the response since the surface resistance is lower than the transparent electrode of the conventional ITO layer and is effective for an improvement of the visibility since the surface reflectance is comparable to glass.

Further, if the product of the present invention is used as a part of a windshield for an automobile and suitable electrodes are provided, it is possible to obtain a windshield having defogging and ice-melting functions. In this case, it is advantageous that since the surface reflectance is comparable to glass, the visibility for the driver will not be impaired, and since the resistance is low as compared with the conventional ITO layer or a 3-layered coating of dielectric/metal/dielectric, the required voltage will be low.

In the present invention, a silver layer having high conductivity is used, and the reflectance at the infrared region is very high. By utilizing this property, the product of the present invention can be used for a window of a building as a heat mirror. In such a case, it is possible to obtain a preferable heat mirror having features such that the infrared reflectance is high and the variation in the reflection color is wide as compared with the conventional ITO layer or the 3-layered coating of dielectric/metal/dielectric.

Further, the product of the present invention has a feature that a low resistance is obtained with a small layer thickness and at a low substrate temperature as compared with the conventional ITO layer which used to be employed as a transparent conductive layer, thus presenting a substantial merit for the production.

As is evident from the foregoing Examples and Comparative Examples, according to the present invention, it is possible to obtain an infrared reflecting article having a sufficiently high visible ray transmission, a very high infrared reflectance and a sharp rising of the reflectance in the near infrared region. In particular, according to the present invention, it is possible to obtain a low radiation glass, particularly a glass having $\epsilon \leq 0.1$.

Further, by adjusting the thicknesses of the respective layers within suitable ranges, it is possible to change the color of reflection quite freely. Thus, the product of the present invention has a feature that the merit in the ornamental aspect is significant. Especially, it is easy to obtain various reflection colors in a pale color tone.

Preferred embodiments of the present invention include not only simple use of the transparent substrate provided with the multi-layered coating of the present invention alone but also a case wherein the transparent plastic film according to the present invention is bonded on a glass sheet as well as a case wherein the product of the present invention is used as a part of a double glazing window or a triple glazing window. The product of the present invention may also be used as a part of a laminated glass.

Thus, according to the present invention, it is possible to obtain a heat mirror having a sufficiently high visible ray transmission and a variety of reflection color, and it is possible to effectively reduce the heating load in a building or a house. On the other hand, it is possible to obtain a transparent conductive coating having a sufficiently high visible ray transmission and a sufficiently low surface resistance, which may effectively be used for a substrate of a display element or for a windshield of an automobile.

The transparent laminated product of the present invention have excellent electromagnetic wave shielding effects and is capable of preventing leakage of electromagnetic waves generated by computer equipments, word processors, etc. from the room to outside, or preventing interfering waves from entering into the room from outside and thus is capable of preventing erroneous actuation of industrial robots or interference to television receivers. Thus, the transparent laminated product of the present invention is useful as an electromagnetic wave shielding window glass.

What is claimed is:
1. A transparent laminated product comprising a transparent substrate and a 5-layered transparent coating composed of a first ZnO layer formed on the substrate, a second Ag layer formed on the first layer, a third ZnO layer formed on the second layer, a fourth Ag layer formed on the third layer and a fifth ZnO layer formed on the fourth layer, and having a visible ray transmission of at least 60%, wherein the thickness of each Ag layer is from 60 to 250 Å.

* * * * *